United States Patent
Ha

(10) Patent No.: US 11,183,629 B2
(45) Date of Patent: Nov. 23, 2021

(54) ELECTRONIC DEVICE AND METHOD FOR FABRICATING THE SAME

(71) Applicant: SK hynix Inc., Gyeonggi-do (KR)

(72) Inventor: Ga-Young Ha, Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/902,077

(22) Filed: Jun. 15, 2020

(65) Prior Publication Data

US 2020/0313077 A1    Oct. 1, 2020

Related U.S. Application Data

(62) Division of application No. 16/218,000, filed on Dec. 12, 2018, now abandoned.

(30) Foreign Application Priority Data

Jan. 11, 2018    (KR) .................. 10-2018-0003671

(51) Int. Cl.
| | |
|---|---|
| *H01L 43/12* | (2006.01) |
| *H01L 43/02* | (2006.01) |
| *H01L 27/108* | (2006.01) |
| *H01L 43/10* | (2006.01) |
| *H01L 43/08* | (2006.01) |

(52) U.S. Cl.
CPC ........ *H01L 43/02* (2013.01); *H01L 27/10805* (2013.01); *H01L 27/10873* (2013.01); *H01L 27/10882* (2013.01); *H01L 43/08* (2013.01); *H01L 43/10* (2013.01); *H01L 43/12* (2013.01)

(58) Field of Classification Search
CPC ............... H01L 43/02; H01L 27/10805; H01L 27/10873; H01L 43/12
See application file for complete search history.

(56) References Cited

U.S. PATENT DOCUMENTS

| | | | |
|---|---|---|---|
| 8,975,088 | B2 | 3/2015 | Satoh et al. |
| 2013/0146958 | A1* | 6/2013 | Kim .................. H01L 21/32053 257/302 |
| 2015/0072440 | A1* | 3/2015 | Inada .................... H01L 27/228 438/3 |
| 2017/0024336 | A1* | 1/2017 | Kim .................... H01F 10/3286 |
| 2017/0077102 | A1* | 3/2017 | Kim .................. H01L 27/10855 |
| 2017/0084828 | A1* | 3/2017 | Hsu ........................ H01L 43/12 |

FOREIGN PATENT DOCUMENTS

KR    10-2013-0007410 A    1/2013

* cited by examiner

*Primary Examiner* — Errol V Fernandes
(74) *Attorney, Agent, or Firm* — Perkins Coie LLP

(57) ABSTRACT

A method for fabricating an electronic device comprising a semiconductor memory is described. The method comprises forming material layers over a substrate; forming a hard mask pattern over the material layers, the hard mask pattern including an amorphous carbon layer; forming a capping protective layer including a portion on sidewalls of the hard mask pattern; and etching the material layers using the hard mask pattern as an etch barrier.

18 Claims, 24 Drawing Sheets

ELECTRONIC DEVICE AND METHOD FOR FABRICATING THE SAME

CROSS-REFERENCE TO RELATED APPLICATION

This patent document is a divisional of U.S. patent application Ser. No. 16/218,000, entitled "ELECTRONIC DEVICE AND METHOD FOR FABRICATING THE SAME" and filed on Dec. 12, 2018, which claims priority of Korean Patent Application No. 10-2018-0003671, entitled "ELECTRONIC DEVICE AND METHOD FOR FABRICATING THE SAME" and filed on Jan. 11, 2018, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element that exhibits different resistance states for storing data.

In one aspect, an electronic device may include a semiconductor memory, and the semiconductor memory may include a predetermined structure; a hard mask pattern disposed over the predetermined structure and including an amorphous carbon layer; and a capping protective layer disposed on sidewalls of the hard mask pattern.

In another aspect, a method for fabricating an electronic device comprising a semiconductor memory is provided. The method comprises forming material layers over a substrate; forming a hard mask pattern over the material layers, the hard mask pattern including an amorphous carbon layer; forming a capping protective layer including a portion on sidewalls of the hard mask pattern; and etching the material layers using the hard mask pattern as an etch barrier.

Implementations of the above electronic device may include one or more the following.

The capping protective layer may include a metal, an oxide, or a nitride, or a combination thereof. The capping protective layer may include $Al_2O_3$, $SiO_2$, SiN, TiN, AlN, BN, Ta, W, Mo, Fe, Al, Cu, or Si, or a combination thereof. The capping protective layer may be disposed to further cover a top surface of the hard mask pattern in addition to covering the sidewalls of the hard mask pattern. The predetermined structure may include a variable resistance element which includes an MTJ (Magnetic Tunnel Junction) structure including a free layer having a variable magnetization direction, a pinned layer having a fixed magnetization direction, and a tunnel barrier layer interposed between the free layer and the pinned layer, and wherein the hard mask pattern may be disposed over the variable resistance element.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device may include forming material layers over a substrate; forming a hard mask pattern over the material layers, the hard mask pattern including an amorphous carbon layer; forming a capping protective layer including a portion on sidewalls of the hard mask pattern; and etching the material layers using the hard mask pattern as an etch barrier.

Implementations of the above method may include one or more the following.

The capping protective layer may include a metal, an oxide, or a nitride, or a combination thereof. The capping protective layer may include $Al_2O_3$, $SiO_2$, SiN, TiN, AlN, BN, Ta, W, Mo, Fe, Al, Cu, or Si, or a combination thereof. The capping protective layer may be formed to include another portion over a top surface of the hard mask pattern. The forming of the capping protective layer may include performing a thermal atomic layer deposition process, a plasma chemical vapor deposition process, an ion beam deposition process, or a sputtering process. The forming of the capping protective layer may include: forming a metal layer over the hard mask pattern and on the sidewalls of the hard mask pattern; and subjecting the metal layer to native oxidation. The forming of the capping protective layer may include: performing a physical etch process on the material layers and the hard mask pattern so that metals included in the material layers is redeposited on the sidewalls of the hard mask pattern. The physical etch process may include an ion beam etching or a reactive ion etching, with an incident angle of ions of 0 to 30 degrees. The etching of the material layers may include a variable resistance element which includes an MTJ (Magnetic Tunnel Junction) structure including a free layer having a variable magnetization direction, a pinned layer having a fixed magnetization direction, and a tunnel barrier layer interposed between the free layer and the pinned layer, and wherein the hard mask pattern may be disposed over the variable resistance element. The forming of the material layers may include: forming a material layer for the free layer, a material layer for the tunnel barrier layer and a material layer for the pinned layer.

In another aspect, an electronic device comprising a semiconductor memory is provided. The semiconductor memory includes: a variable resistance element having a resistance value which changes according to a logic value of data stored therein and including: a free layer having a variable magnetization direction; a pinned layer having a fixed magnetization direction; and a tunnel barrier layer interposed between the free layer and the pinned layer, and wherein the variable resistance element is etched using a hard mask pattern including an amorphous carbon layer and a capping protective layer disposed over the hard mask pattern and including a metal, an oxide, or a nitride, or a combination thereof, and wherein the variable resistance element exhibits a better vertical profile than a case in which a variable resistance element is etched without the capping protective layer.

In some implementations, the capping protective layer surrounds on sidewalls of the hard mask pattern. In some implementations, the capping protective layer includes $Al_2O_3$, $SiO_2$, SiN, TiN, AlN, BN, Ta, W, Mo, Fe, Al, Cu, or Si, or a combination thereof. In some implementations, the capping protective layer is formed on a top surface of the hard mask pattern. In some implementations, the hard mask pattern has a smaller width than that of the variable resistance element and the capping protective layer is formed on the variable resistance element not covered by the hard mask pattern.

These and other aspects, implementations and associated advantages are described in greater detail in the drawings, the description and the claims.

DETAILED DESCRIPTION

Figure 1A:
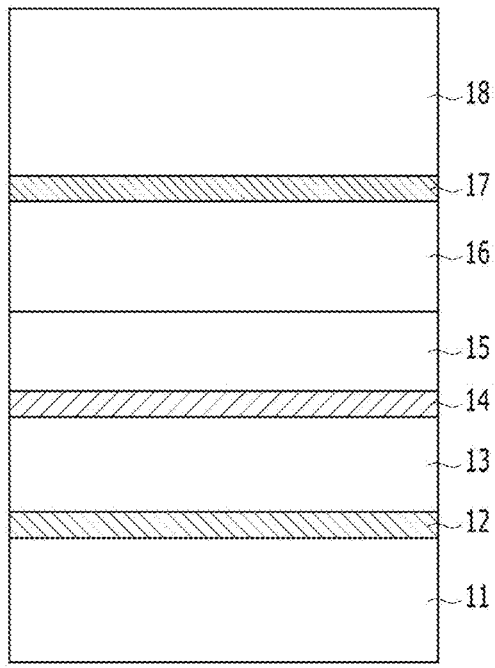
FIGS. 1A to 1E are cross-sectional views illustrating a method for fabricating a variable resistance element in accordance with one example where a variable resistance element is formed to have a distorted profile as the rapid pattern collapse phenomenon in one direction occurs.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

Prior to explaining implementations of the disclosed technology in the present disclosure, a variable resistance element in accordance with a comparative example will be explained.

FIGS. 1A to 1E are cross-sectional views illustrating a method for fabricating a variable resistance element in accordance with one example where a variable resistance element (see the reference numeral 1 of FIG. 1E) is formed to have a distorted profile as the rapid pattern collapse phenomenon in one direction occurs.

Referring to FIG. 1A, a conductive layer 12 for a bottom electrode may be formed over a substrate 11 where a predetermined structure (not shown) is formed.

A material layer 13 for a free layer, a material layer 14 for a tunnel barrier layer and a material layer 15 for a pinned layer may be sequentially formed over the conductive layer 12 for the bottom electrode.

A material layer 16 for a capping layer and a conductive layer 17 for a top electrode may be sequentially formed over the material layer 15 for the pinned layer.

A hard mask 18 may be formed over the material layer 17 for the top electrode. As the degree of high integration increases, since the variable resistance element (see the reference numeral 1 of FIG. 1E) becomes thicker, the etching of the variable resistance element (see the reference numeral 1 of FIG. 1E) becomes more difficult. In order to improve the vertical profile of the variable resistance element, the hard mask 18 is formed of a material having an excellent etch selectivity and hardness to the under layer(s). Examples of such materials may include various metal, carbon, or others.

Figure 1B:
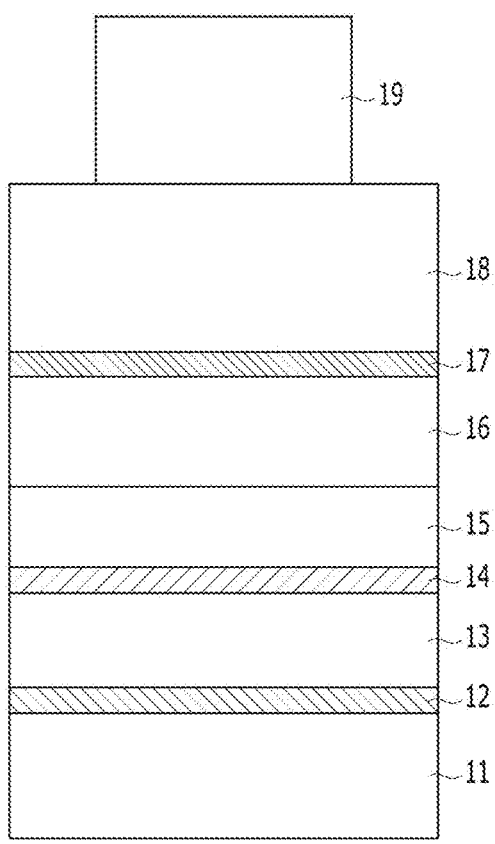

Referring to FIG. 1B, a photoresist pattern 19 may be formed over the hard mask 18. Prior to forming the photoresist pattern 19, an anti-reflection layer (not shown) may be further formed over the hard mask 18.

Figure 1C:
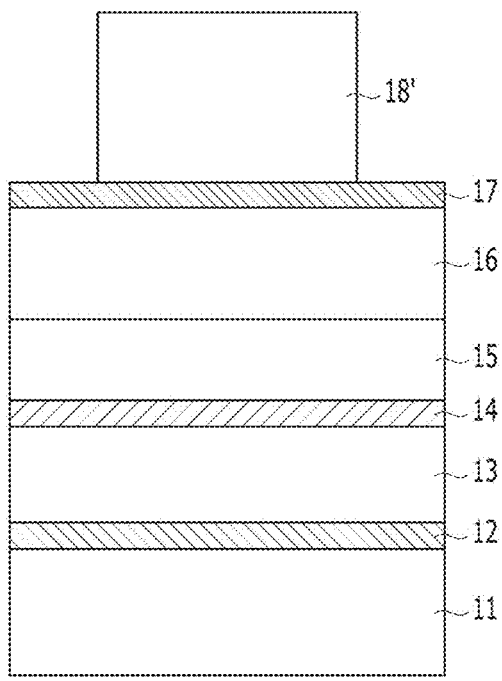

Referring to FIG. 1C, a hard mask pattern 18' may be formed by etching the hard mask 18 by using the photoresist pattern 19 as an etch barrier.

This etch process may be performed by using a suitable etching technique such as a reactive ion etching (RIE). Even though the hard mask 18 is formed of a material having a high etch selectivity to the underlayer(s), sidewalls of the hard mask 18 tend to be damaged or deteriorated during this etch process. Thus, the etch process for forming the hard mask pattern 18' causes the sidewalls of the hard mask 18 to be deteriorated or damaged.

The anti-reflection layer (not shown) and the photoresist pattern 19 may be removed during forming the hard mask pattern 18' or by a separate strip process.

Figure 1D:
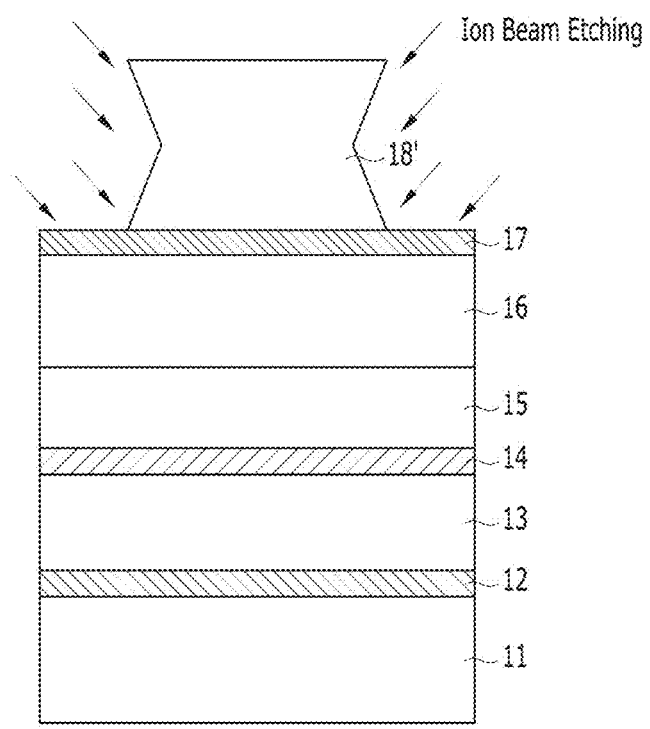

Referring to FIG. 1D, the conductive layer 17 for the top electrode, the material layer 16 for the capping layer, the material layer 15 for the pinned layer 15, the material layer 14 for the tunnel barrier layer, the material layer 13 for the free layer and the conductive layer 12 for the bottom electrode may be sequentially etched by using the hard mask pattern 18' as an etch barrier.

This secondary etch process may be performed by using a suitable etching technique such as an ion beam etching (IBE). As explained above, during the etch process for forming the hard mask pattern 18', which occurs before the secondary etch process, the sidewalls of the hard mask 18 have been already damaged or deteriorated. Thus, a material included in the hard mask pattern 18' in which sidewall deterioration has occurred in the previous etch process may not withstand the secondary etch process and thus a severe sidewall loss may occur. Even if the hard mask pattern 18' is formed of or includes carbon which is known as a superior etch selectivity and hardness to the underlayer(s), the hard mask pattern 18' cannot sufficiently serve as an etch barrier. Therefore, the variable resistance element (see the reference numeral 1 of FIG. 1E) may experience a severe sidewall loss, resulting in a distorted profile. Further, undesired pattern collapse may occur.

Figure 1E:
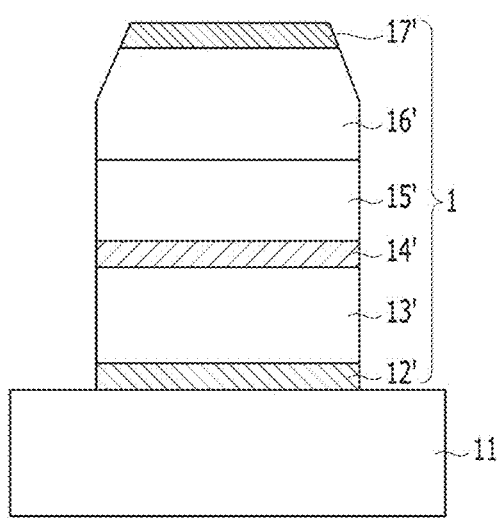

Referring to FIG. 1E, the variable resistance element 1 may include a bottom electrode 12', a free layer 13', a tunnel barrier layer 14', a pinned layer 15', a capping layer 16' and a top electrode 17'. As discussed above, the comparative example of the variable resistance element 1 as shown in FIG. 1E has a distorted profile as the rapid pattern collapse phenomenon in one direction occurs. The collapse of the hard mask pattern and the distortion in the variable resistance element 1 may be more severe when the electronic device has a reduced size, for example, 25 nm or less, due to the shortage of the etch margin of the hard mask pattern 18'. Such a distorted profile may deteriorate electrical characteristics of the variable resistance element 1.

A variable resistance element has a structure that exhibits different resistance states or values and is capable of being switched between different resistance states in response to an applied bias (for example, a current or voltage). A resistance state of such a variable resistance element may be changed by applying a voltage or current of a sufficient magnitude (i.e., a threshold) in a data write operation. The different resistance states of different resistance values of the variable resistance element can be used for representing different data for data storage. Thus, the variable resistance element may store different data according to the resistance state. The variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may be implemented to include an MTJ (Magnetic Tunnel Junction) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

In order to provide a variable resistance element which can prevent distortion of the profile due to a rapid loss of a hard mask pattern during the etching process, the disclosed technology can be implemented to provide a capping protective layer for a hard mask pattern to protect the hard mask pattern and reduce the above-discussed undesired pattern collapse phenomenon or a sidewall loss during the etching process so that the hard mask pattern can sufficiently serve to an etch barrier to achieve a desired shape of the underlying layers in forming the final variable resistance element.

FIGS. 2A to 2E are cross-sectional views illustrating an exemplary variable resistance element and a method for fabricating the same in accordance with an implementation of the disclosed technology.

An example of the variable resistance element in accordance with the implementation of the disclosed technology will be described with reference to FIG. 2E and then an exemplary method for fabricating the same will be described with reference to FIGS. 2A to 2E.

Figure 2A:
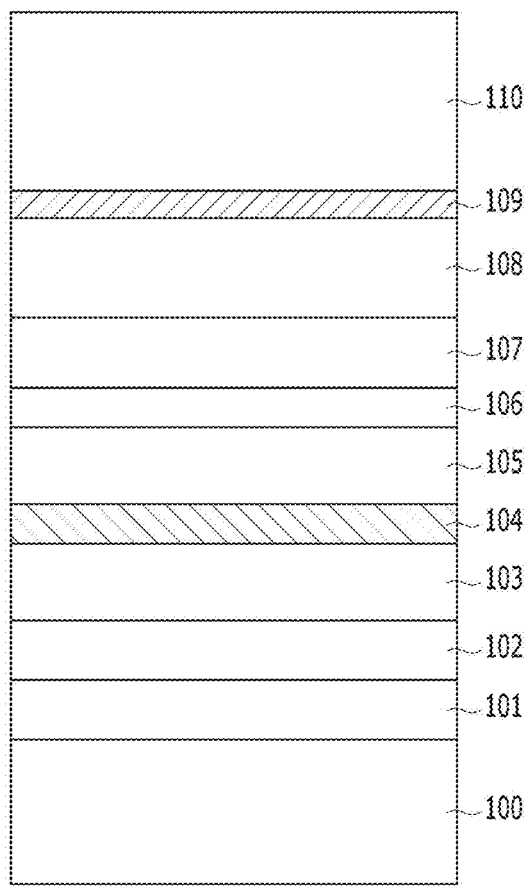
FIGS. 2A to 2F are cross-sectional views illustrating an exemplary variable resistance element and a method for fabricating the same in accordance with an implementation of the disclosed technology.
Figure 2B:
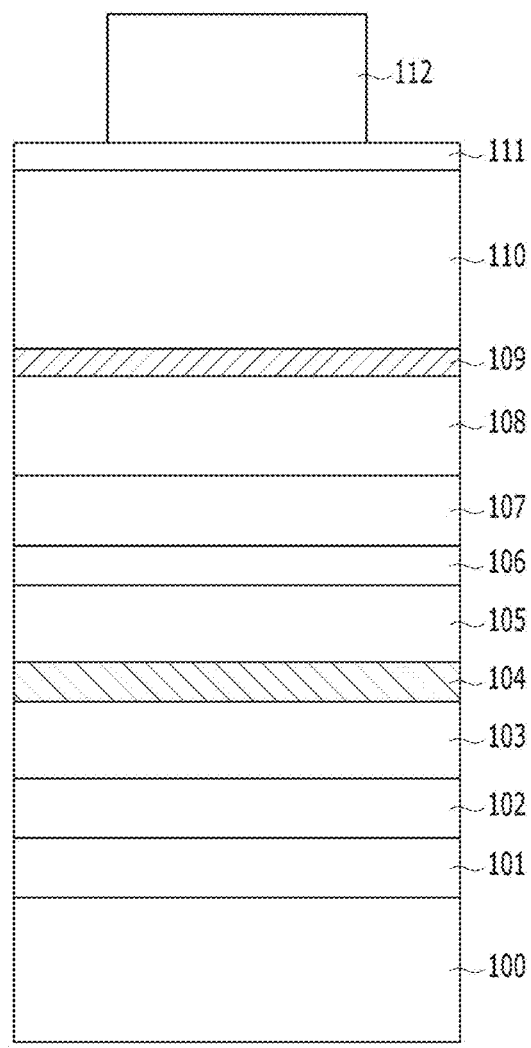
Figure 2C:
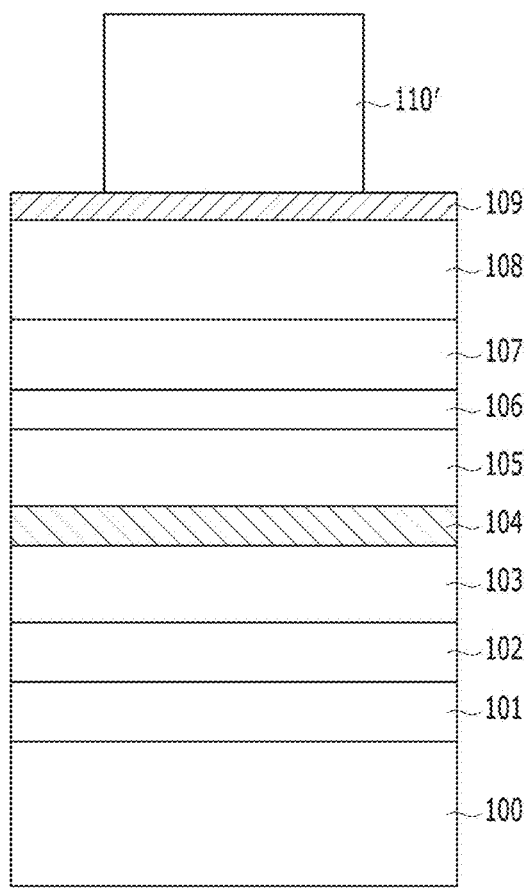
Figure 2D:
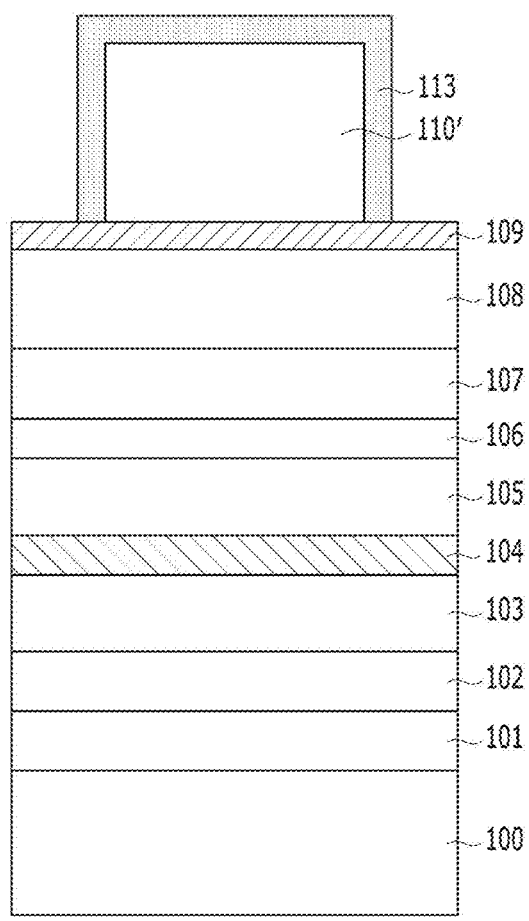
Figure 2E:
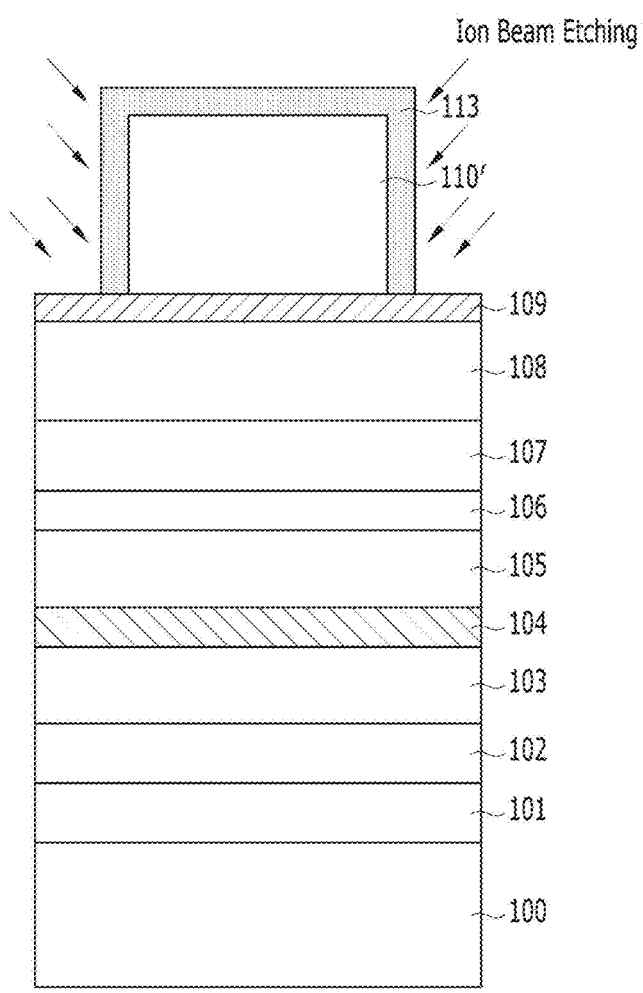

Referring to FIG. 2E, a variable resistance element 10 in accordance with the implementation of the disclosed technology may include an MTJ structure including a free layer 103' having a variable magnetization direction, a pinned layer 105' having a fixed magnetization direction, and a tunnel barrier layer 104' interposed between the free layer 103' and the pinned layer 105'.

The free layer 103' may have a variable magnetization direction that causes the MTJ structure to have a variable resistance value. The variable magnetization of the free layer 103' is changed under an applied signal (e.g., a driving current above a certain threshold) to produce different magnetization states for the MTJ structure. With the change of the magnetization direction of the free layer 103', the relative relationship of the magnetization directions of the free layer 103' and the pinned layer 105' also changes, which allows the variable resistance element 10 to store different data or represent different data bits. The free layer 103' may also be referred as a storage layer or the like. The magnetization direction of the free layer 103' may be substantially perpendicular to a surface of the free layer 103', the tunnel barrier layer 104' and the pinned layer 105'. In other words, the magnetization direction of the free layer 103' may be substantially parallel to stacking directions of the free layer 103', the tunnel barrier layer 104' and the pinned layer 105'. Therefore, the magnetization direction of the free layer 103' may be changed between a downward direction and an upward direction. The change in the magnetization direction of the free layer 103' may be induced by a spin transfer torque exerted by an applied current or voltage.

The free layer 103' may have a single-layer or multilayer structure including a ferromagnetic material. For example, the free layer 103' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 104' may allow the tunneling of electrons in both data reading and data writing operations. In a write operation for storing new data, a high write current may be directed through the tunnel barrier layer 104' to change the magnetization direction of the free layer 103' and thus to change the resistance state of the MTJ for writing a new data bit. In a reading operation, a low reading current may be directed through the tunnel barrier layer 104' without changing the magnetization direction of the free layer 103' to measure the existing resistance state of the MTJ under the existing magnetization direction of the free layer 103' to read the stored data bit in the MTJ. The tunnel barrier layer 104' may include a dielectric oxide, for example, an oxide such as MgO, CaO, SrO, TiO, VO, or NbO or others.

The pinned layer 105' may have a pinned magnetization direction which contrasts with the magnetization direction of the free layer 103', and may be referred to as a reference layer or the like. In some implementations, the magnetization direction of the pinned layer 105' may be pinned in a downward direction. In some implementations, the magnetization direction of the pinned layer 105' may be pinned in an upward direction.

The pinned layer 105' may have a single-layer or multi-layer structure including a ferromagnetic material. For example, the pinned layer 105' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or others.

If a voltage or current is applied to the variable resistance element 10, the magnetization direction of the free layer 103' may be changed by spin torque transfer. When the magnetization directions of the free layer 103' and the pinned layer 105' are parallel to each other, the variable resistance element 10 may be in a low resistance state to store a particular designated digital data bit such as '0'. Conversely, when the magnetization directions of the free layer 103' and the pinned layer 105' are anti-parallel to each other, the variable resistance element 10 may be in a high resistance state to store a different designated digital data bit such as '1'. In some implementations, the variable resistance element 10 can be configured to store data bit '1' when the magnetization directions of the free layer 103' and the pinned layer 105' are parallel to each other and to store data bit '0' when the magnetization directions of the free layer 103' and the pinned layer 105' are anti-parallel to each other.

In some implementations, the variable resistance element 10 may further include one or more layers performing various functions to improve a characteristic of the MTJ structure. For example, the variable resistance element 10 may further include at least one of a buffer layer 101', an under layer 102', a spacer layer 106', a magnetic correction layer 107', a capping layer 108' or a top electrode 109'.

The buffer layer 101' may be disposed under the under layer 102' and aid in crystal growth of the under layer 102'. When the buffer layer 101' is formed under the under layer 102', it is possible to aid in crystal growth of the under layer 102' and thus improve perpendicular magnetic crystalline anisotropy of the free layer 103'. The buffer layer 101' may have a single-layer or multilayer structure including a metal, a metal alloy, a metal nitride, or a metal oxide, or a combination thereof. Moreover, the buffer layer 101' may be formed of or include a material having a good compatibility with a bottom electrode (not shown) in order to resolve the lattice constant mismatch between the bottom electrode and the under layer 102'. For example, the buffer layer 101' may include tantalum (Ta).

The under layer 102' may be disposed under the free layer 103' and serve to improve perpendicular magnetic crystalline anisotropy of the free layer 103'. The under layer 102' may have a single-layer or multilayer structure including a metal, a metal alloy, a metal nitride, or a metal oxide, or a combination thereof.

The spacer layer 106' may be interposed between the magnetic correction layer 107' and the pinned layer 105' and function as a buffer between the magnetic correction layer 107' and the pinned layer 105'. The spacer layer 106' may serve to improve characteristics of the magnetic correction layer 107'. The spacer layer 106' may include a noble metal such as ruthenium (Ru).

The magnetic correction layer 107' may serve to offset the effect of the stray magnetic field produced by the pinned layer 105'. In this case, the effect of the stray magnetic field of the pinned layer 105' can decrease, and thus a biased magnetic field in the free layer 103' can decrease. The magnetic correction layer 107' may have a magnetization direction anti-parallel to the magnetization direction of the pinned layer 105'. In the implementation, when the pinned layer 105' has a downward magnetization direction, the magnetic correction layer 107' may have an upward magnetization direction. Conversely, when the pinned layer 105' has an upward magnetization direction, the magnetic correction layer 107' may have a downward magnetization direction. The magnetic correction layer 107' may have a single-layer or multilayer structure including a ferromagnetic material.

In this implementation, the magnetic correction layer 107' is located above the pinned layer 105', but the position of the magnetic correction layer 107' may be changed. For example, the magnetic correction layer 107' may be located above, below, or next to the MTJ structure while the magnetic correction layer 107' is patterned separately from the MTJ structure.

The capping layer 108' may function as a hard mask for patterning the variable resistance element 10. In some implementations, the capping layer 108' may include various conductive materials such as a metal. In some implementations, the capping layer 108' may include a metallic material having almost none or a small number of pin holes and high resistance to wet and/or dry etching. In some implementations, the capping layer 108' may include a metal, a nitride or an oxide, or a combination thereof. For example, the capping layer 108' may include a noble metal such as ruthenium (Ru).

The top electrode 109' may act as a conductive line of the variable resistance element 10 and also function as a part of a hard mask to pattern the variable resistance element 10. The top electrode 109' may have a single-layer or multilayer structure including a conductive material such as a metal. For example, the top electrode 109' may include tungsten (W).

In the variable resistance element 10 as shown in FIG. 2E, the free layer 103' is formed below the pinned layer 105'. Other implementations are also possible such that the free layer 103' can be formed above the pinned layer 105'.

The method for fabricating the variable resistance element 10 in accordance with the implementation will be exemplarily explained with reference to FIGS. 2A to 2E.

Referring to FIG. 2A, a material layer 101 for a buffer layer may be formed over a substrate 100 where a predetermined structure (not shown) is formed.

The substrate 100 may include a semiconductor substrate. The semiconductor substrate may be in a single-crystal state and include a silicon-containing material. In some implementations, the semiconductor substrate may include a single-state silicon-containing material. In some implementations, the substrate 100 may be a bulk silicon substrate or a silicon on insulator (SOI) substrate where a support substrate, a buried insulating layer and a single-crystal silicon layer are sequentially stacked.

The predetermined structure formed on the substrate 100 may include a switching element (not shown). The switching element may be connected to the variable resistance element (see the reference numeral 10 of FIG. 2E) and serve to control the supply of a bias to the variable resistance element 10. The switching element may include a transistor, or a diode, etc. The switching element may be electrically connected to the contact plug at a portion of the switching element and to a conductive line, e.g., a source line (not shown), at another portion of the switching element.

A material layer 102 for an under layer may be formed over the material layer 101 for the buffer layer.

A material layer 103 for a free layer, a material layer 104 for a tunnel barrier layer and a material layer 105 for a pinned layer may be sequentially formed over the material layer 102 for the under layer.

A material layer 106 for a spacer layer may be formed over the material layer 105 for the pinned layer.

A material layer 107 for a magnetic correction layer may be formed over the material layer 106 for the spacer layer.

A material layer 108 for a capping layer may be formed over the material layer 107 for the magnetic correction layer.

A material layer 109 for a top electrode may be formed over the material layer 108 for the capping layer.

A hard mask 110 may be formed over the material layer 109 for the top electrode.

The hard mask 110 may include an amorphous carbon. Since the amorphous carbon is one of materials having an excellent etch selectivity and hardness, it can be used as a suitable hard mask for forming a vertical profile of the variable resistance element.

Figure 6:
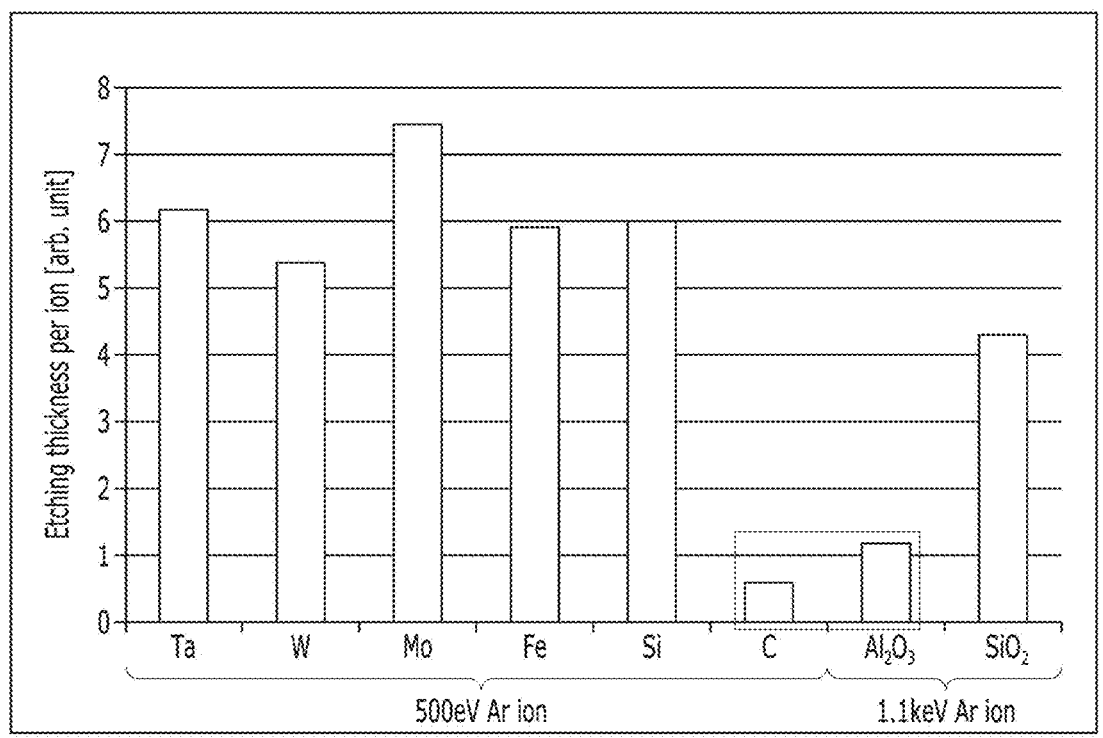
FIG. 6 shows graphs showing an etch selectivity of various materials.

FIG. 6 shows graphs showing an etch selectivity of various materials. The selectivity is the ratio of the etching rate of two materials that are simultaneously exposed to the etching. This can be, for example, the photoresist structures of the etching mask, as well as the material to be etched, but also two vertically stacked materials that are to be etched in succession.

Referring to FIG. 6, the etching thickness values of some materials per incident ion under two different ion incident energy levels at 500 eV and 1.1 KeV of argon ions are provided. In the listed materials, the amorphous carbon has a relatively higher etch selectivity than other listed materials. In the materials listed in FIG. 6, the amorphous carbon has the smallest etching thickness per ion, which means that the amorphous carbon is not damaged as much as other listed materials having a higher etch selectivity during a subsequent etching of its underlayer(s).

In some implementations, an adhesion enhancing layer (not shown) may be interposed between the material layer 109 for the top electrode and the hard mask 110 in order to improve adhesion between the material layer 109 for the top electrode and the hard mask 110, thereby preventing a lifting problem. The adhesion enhancing layer may include an oxide-based thin layer such as a PETEOS layer, an HDP layer, a PSG layer, a $SiO_2$ layer or a USG layer.

Referring to FIG. 2B, an anti-reflection layer 111 may be formed over the hard mask 110 in order to prevent reflection during an exposure process.

Subsequently, a photoresist pattern 112 may be formed over the anti-reflection layer 111.

Referring to FIG. 2C, a hard mask pattern 110' may be formed by etching the hard mask 110 using the anti-reflection layer 111 and the photoresist pattern 112 as an etch barrier.

The anti-reflection layer 111 and the photoresist pattern 112 may be removed during the forming of the hard mask pattern 110' or by performing a separate strip process.

Referring to FIG. 2D, a capping protective layer 113 for protecting the hard mask pattern 110' may be formed over the hard mask pattern 110' and on sidewalls of the hard mask pattern 110'. The capping protective layer 113 may surround the hard mask pattern 110' and cover the top surface of the hard mask pattern 110'.

The capping protective layer 113 can protect the hard mask pattern 110' during a subsequent IBE process to prevent the hard mask pattern 110' from being deformed or a sidewall loss. Even though the hard mask pattern 110' is formed of a material having an excellent etch selectivity and hardness such as an amorphous carbon, sidewalls of the hard mask pattern 110' may be deteriorated during the forming of the hard mask pattern 110' in FIG. 2D. In accordance with the implementation of the discloses technology, even if the sidewall deterioration occurs in the hard mask pattern 110', the capping protective layer 113 which surrounds the sidewall of the hard mask pattern 110' can protect the hard mask pattern 110' and thus a sidewall loss of the hard mask pattern 110' can be prevented during a subsequent IBE process.

The capping protective layer 113 may include a metal, an oxide, or a nitride, or a combination thereof.

In some implementations, the capping protective layer 113' may include $Al_2O_3$, $SiO_2$, SiN, TiN, AlN, BN, Ta, W, Mo, Fe, Al, Cu, or Si, or a combination thereof.

Referring to FIG. 6, $Al_2O_3$ has a second smallest etching thickness per ion amongst the listed materials, which means $Al_2O_3$ has a relatively good etch selectivity along with the amorphous carbon. Accordingly, $Al_2O_3$ may be used as the capping protective layer 113 in some implementations.

In some implementations, the capping protective layer 113 may be formed by various methods such as a thermal atomic layer deposition process, a plasma chemical vapor deposition process, an ion beam deposition process, or a sputtering process.

In some implementations, when the capping protective layer 113 is formed of or includes an oxide such as $Al_2O_3$, the capping protective layer 113 may be formed by forming a metal layer over a resultant structure in which the hard mask pattern 110' is formed and then subjecting the metal layer to native oxidation.

In the implementation of FIG. 2D, the capping protective layer 113 is formed over the hard mask pattern 110' including a top surface and sidewalls of the hard mask pattern 110'. In another implementation, the capping protective layer 113 may be formed not only over the hard mask pattern 110' including the top surface and sidewalls of the hard mask pattern 110' but also over the exposed material layer 109 for the top electrode in which the hard mask pattern 110' is not formed.

An etch process for forming the variable resistance element 10 may be performed as shown in FIG. 2E. The material layer 109 for the top electrode, the material layer 108 for the capping layer, the material layer 107 for the magnetic correction layer, the material layer 106 for the spacer layer, the material layer 105 for the pinned layer, the material layer 104 for the tunnel barrier layer, the material layer 103 for the free layer, the material layer 102 for the under layer and the material layer 101 for the buffer layer may be sequentially etched using at least the hard mask pattern 110' as an etch barrier to form the variable resistance element (see the reference numeral 10 of FIG. 2E) over the substrate 100.

Figure 2F:
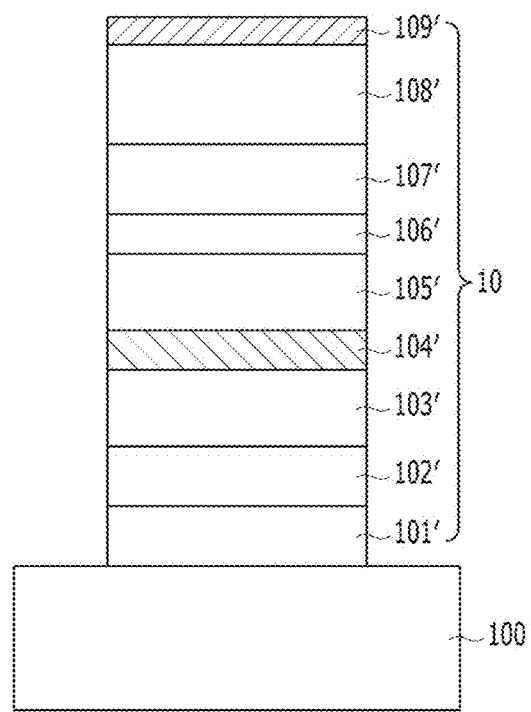

Referring to FIG. 2F, the variable resistance element 10 may include the buffer layer 101', the under layer 102', the free layer 103', the tunnel barrier layer 104', the pinned layer 105', the spacer layer 106', the magnetic correction layer 107', the capping layer 108' and the top electrode 109'.

The etch process may be performed by a method having a strong physical etching property such as IBE or RIE. In the etch process, the capping protective layer 113 formed over the hard mask pattern 110' provides a protection for the hard mask pattern 110' during a subsequent etching by including a material with a high etch selectivity and can prevent a sidewall loss or deformation of the hard mask pattern 110'. As a result, it is possible to secure a uniform profile of the variable resistance element 10 by using the hard mask pattern 110' as an etch barrier.

In some implementations, the material layer 109 for the top electrode may be etched using the hard mask pattern 110' as an etch barrier to form the top electrode 109'. Then, the material layer 108 for the capping layer, the material layer 107 for the magnetic correction layer, the material layer 106 for the spacer layer, the material layer 1056 for the pinned layer, the material layer 104 for the tunnel barrier layer, the material layer 103 for the free layer, the material layer 102 for the under layer and the material layer 101 for the buffer layer may be etched using at least the top electrode 109', or both the hard mask pattern 110' and the top electrode 109' as an etch barrier to form the variable resistance element 10 over the substrate 100.

The hard mask pattern 110' and the top electrode 109' may function as a double hard mask to facilitate patterning the variable resistance element 10.

In this implementation, the hard mask pattern 110' may be removed during forming the variance resistance element 10 or by performing a separate strip process. However, in another implementation, the hard mask pattern 110' and the capping protective layer 113 may not be removed and remain in the final variable resistance element 10 as shown in FIG. 4.

Figure 4:
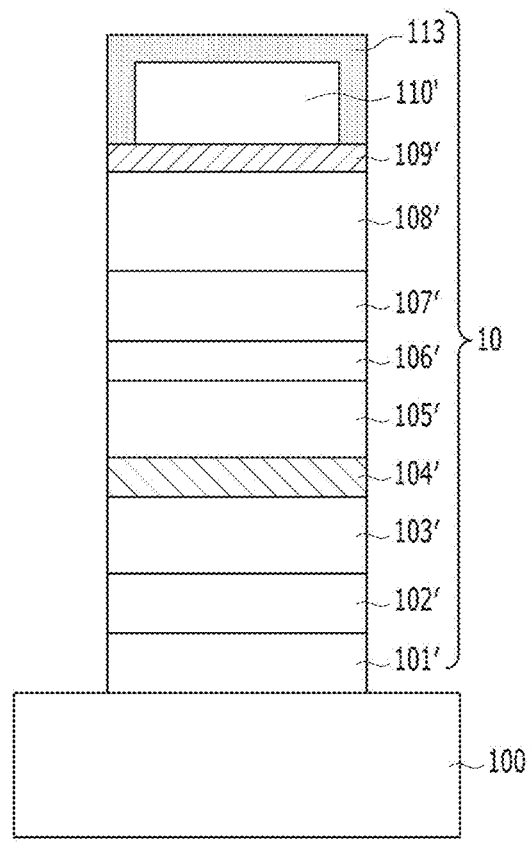
FIG. 4 is a cross-sectional view illustrating further another exemplary variable resistance element in accordance with an implementation of the disclosed technology.

FIG. 4 is a cross-sectional view illustrating further another exemplary variable resistance element in accordance with an implementation of the disclosed technology.

Referring to FIG. 4, the variable resistance element 10 may include may further include the hard mask pattern 110' and the capping protective layer 113 in addition to the buffer layer 101', the under layer 102', the free layer 103', the tunnel barrier layer 104', the pinned layer 105', the spacer layer 106', the magnetic correction layer 107', the capping layer 108' or the top electrode 109'.

Further, meanwhile, in the implementation shown in FIGS. 2A to 2E, the hard mask 110 and the material layer 109 for the top electrode are separate from each other and the hard mask pattern 110' is formed over the material layer 109 for the top electrode. However, in another implementation, the material layer 109 for the top electrode may be omitted and the hard mask pattern 110' may be used as a top electrode. This is further explained below with reference to FIGS. 3A to 3F.

In this implementation, the capping protective layer 113 is formed by using a deposition process such as ALD (Atomic Layer Deposition), CVD (Chemical Vapor Deposition) or ILD (Interlayer Dielectric Deposition) or by depositing a metal layer and subjecting the metal layer to a native oxidation. In another implementation, the capping protective layer 113 may be formed by redeposition during an IBE process for etching the variable resistance element. This will be explained in more detail with reference to FIGS. 3A to 3F.

FIGS. 3A to 3F are cross-sectional views illustrating another exemplary variable resistance element and a method for fabricating the same in accordance with an implementation of the disclosed technology. The following descriptions will be focused on a difference from the implementation of FIGS. 2A to 2E.

Figure 3A:
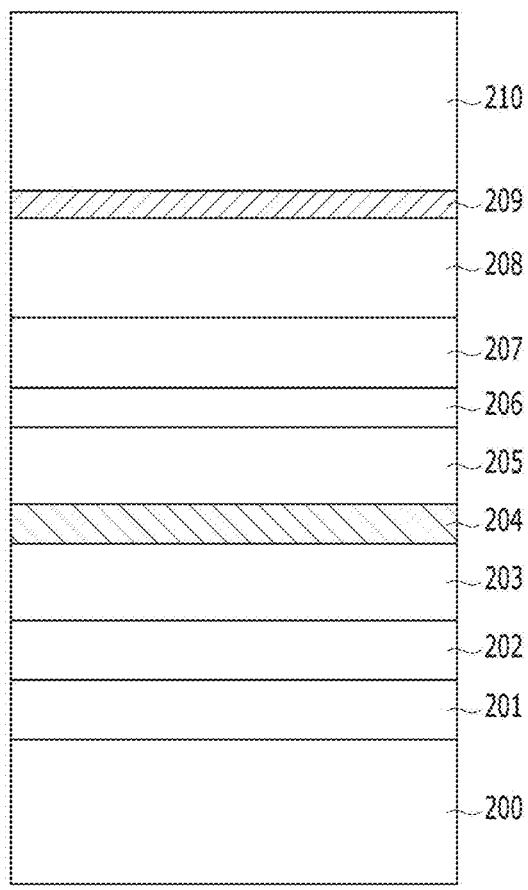
FIGS. 3A to 3F are cross-sectional views illustrating another exemplary variable resistance element and a method for fabricating the same in accordance with an implementation of the disclosed technology.
Figure 3B:
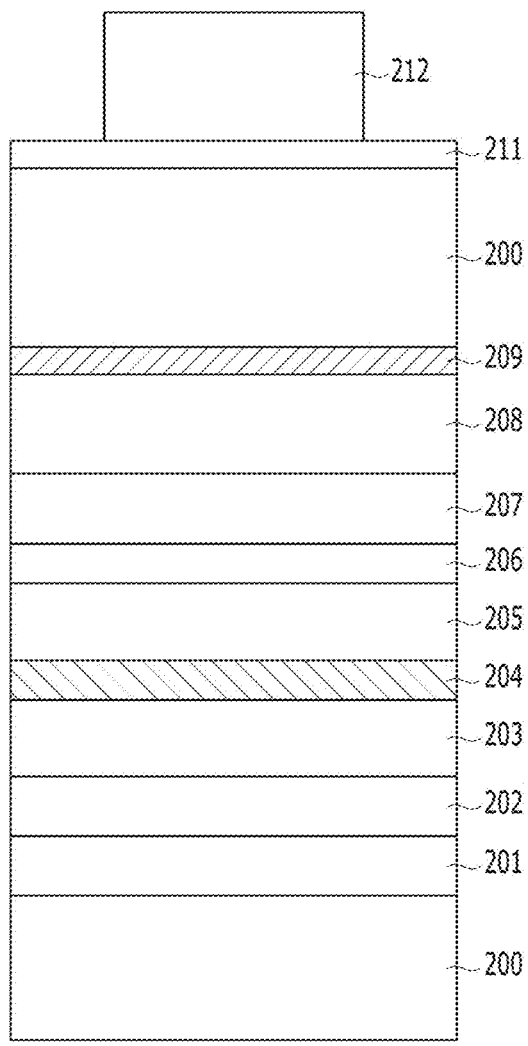
Figure 3C:
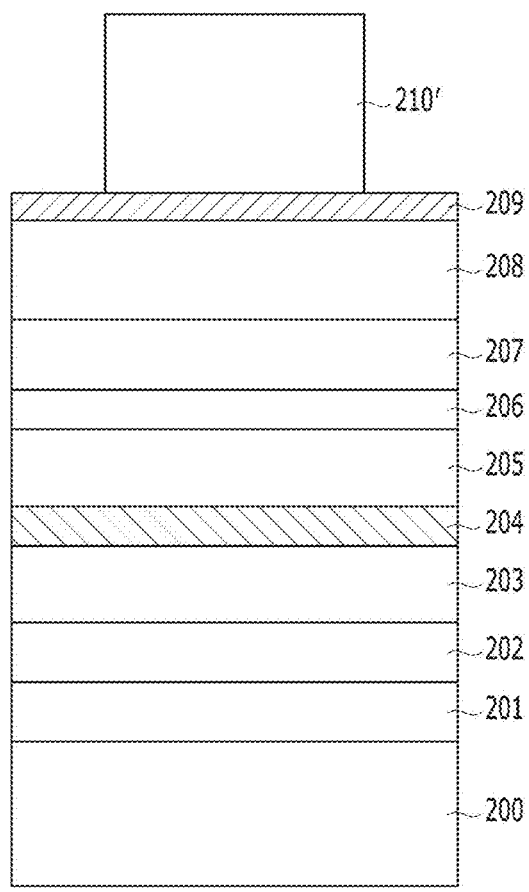
Figure 3D:
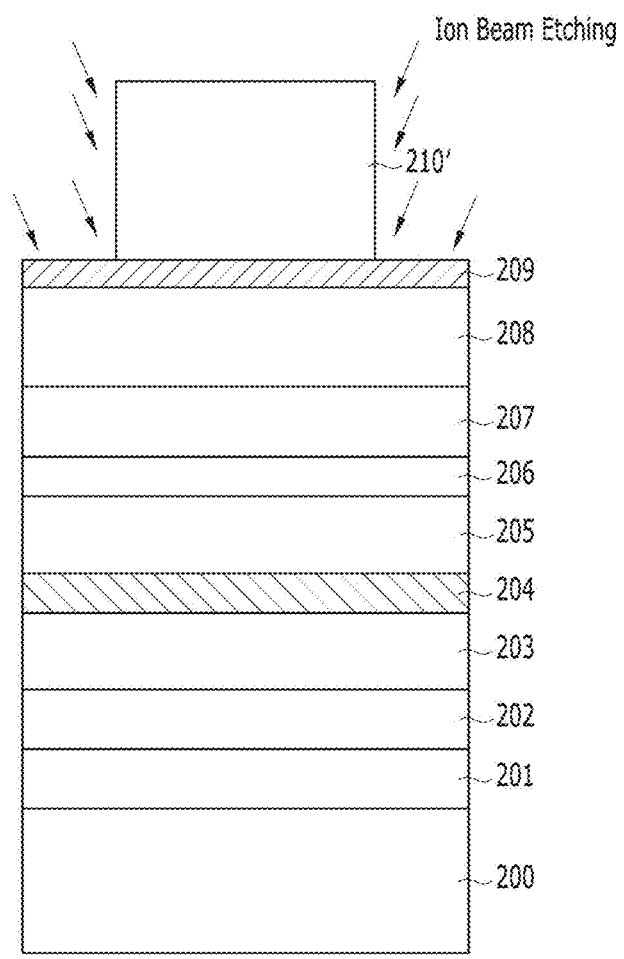
Figure 3E:
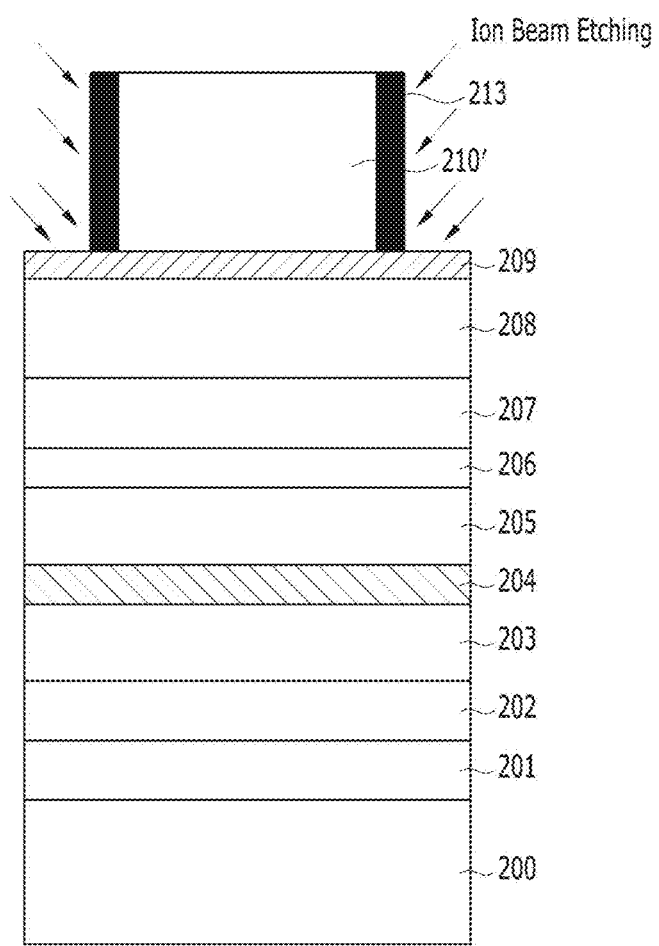
Figure 3F:
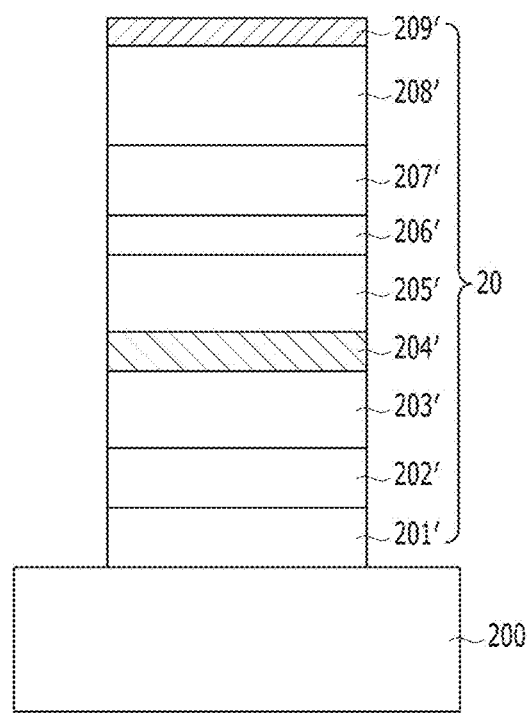

First, referring to FIG. 3F, a variable resistance element 20 in accordance with the implementation of the present disclosure may include a buffer layer 201', an under layer 202', a free layer 203', a tunnel barrier layer 204', a pinned layer 205', a spacer layer 206', a magnetic correction layer 207', a capping layer 208' and a top electrode 209'.

The method for fabricating the variable resistance element 20 will be exemplarily explained with reference to FIGS. 3A to 3F.

Referring to FIG. 3A, a material layer 201 for a buffer layer, a material layer 202 for an under layer, a material layer 203 for a free layer, a material layer 204 for a tunnel barrier layer, a material layer 205 for a pinned layer, a material layer 208 for a capping layer, a material layer 209 for a top electrode and a hard mask 210 may be sequentially formed over a substrate 200 in which required predetermined structures (not shown) are formed.

The hard mask 210 may be formed of or include a material having an excellent etch selectivity and hardness such as amorphous carbon.

Referring to FIG. 3B, an anti-reflection layer 211 and a photoresist pattern 212 may be formed over the hard mask 210.

Referring to FIG. 3C, a hard mask pattern 210' may be formed by etching the hard mask 210 using the photoresist pattern 212 as an etch barrier.

The anti-reflection layer 211 and the photoresist pattern 212 may be removed during forming the hard mask pattern 210' or by performing a separate strip process.

Referring to FIG. 3D, a physical etch process such as an IBE or RIE with a low incident angle of ions (e.g., Argon ions) may be performed to a resultant structure in which the hard mask pattern 210' is formed. This process for forming a capping protective layer (e.g., the reference numeral 213 of FIG. 3E) may be performed as an initial step of a physical etch process for etching the variable resistance element 20.

In some implementations, metal materials included in the underlying layers below the hard mask pattern 210' may be redeposited along sidewalls of the hard mask pattern 210' by performing a physical etch process with a low incident angle of ion of 0 to 30 degrees.

This physical etch process may be performed for several to several tens of seconds, for example, 1 to 100 seconds.

The capping protective layer 213 may be formed on sidewalls of the hard mask pattern 210'. In some implementations, the capping protective layer 213 may be formed over a top surface of the hard mask pattern 210' in addition to the sidewalls of the hard mask pattern 210'. The capping protective layer 213 can protect the hard mask pattern 210' during a subsequent etch process for etch the variable resistance element 20 to prevent the hard mask pattern 210' from being deformed or a sidewall loss. Even though the hard mask pattern 210' is formed of a material having an excellent etch selectivity and hardness such as an amorphous carbon, sidewalls of the hard mask pattern 210' may be deteriorated during forming the hard mask pattern 210' in FIG. 3D. In accordance with the implementation of the disclosed technology, even if sidewall deterioration occurs, the capping protective layer 213 can protect the hard mask pattern 110' and thus a sidewall loss can be prevented during a subsequent physical etch process for forming the variable resistance element 20.

An etch process for forming the variable resistance element 20 may be performed.

Referring to FIG. 3F, the material layer 209 for the top electrode, the material layer 208 for the capping layer, the material layer 207 for the magnetic correction layer, the material layer 206 for the spacer layer, the material layer 205 for the pinned layer, the material layer 204 for the tunnel barrier layer, the material layer 203 for the free layer, the material layer 202 for the under layer and the material layer 201 for the buffer layer may be sequentially etched using at least the hard mask pattern 210' as an etch barrier to form the variable resistance element 20. The variable resistance element 20 may include the buffer layer 201', the under layer 202', the free layer 203', the tunnel barrier layer 204', the pinned layer 205', the spacer layer 206', the magnetic correction layer 207', the capping layer 208' and the top electrode 209'.

The etch process may be performed by a method having a strong physical etching property such as IBE or RIE. In the etch process, the capping protective layer 213 formed over the hard mask pattern 210' provides a protection for the hard mask pattern 210' during a subsequent etching by including a material with a high etch selectivity and can prevent a sidewall loss or deformation of the hard mask pattern 210'. As a result, it is possible to secure a uniform profile of the variable resistance element 20 by using the hard mask pattern 210' as an etch barrier.

In this implementation, the hard mask pattern 210' may be removed during forming the variance resistance element 20 or by performing a separate strip process. However, in another implementation, the hard mask pattern 210' and the capping protective layer 213 may not be removed and remain in the final variable resistance element 20 as shown in FIG. 5.

Figure 5:
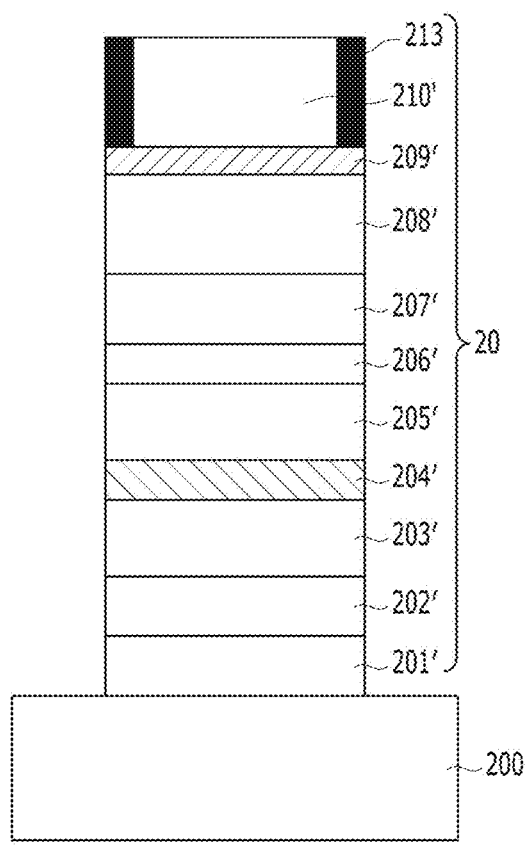
FIG. 5 is a cross-sectional view illustrating still further another exemplary variable resistance element in accordance with an implementation of the disclosed technology.

FIG. 5 is a cross-sectional view illustrating still further another exemplary variable resistance element in accordance with an implementation of the disclosed technology.

Referring to FIG. 5, the variable resistance element 20 may include may further include the hard mask pattern 210' and the capping protective layer 213 in addition to the buffer layer 201', the under layer 202', the free layer 203', the tunnel barrier layer 204', the pinned layer 205', the spacer layer 206', the magnetic correction layer 207', the capping layer 208' or the top electrode 209'.

In accordance with the implementations of the present disclosure, the capping protective layer for protecting the hard mask pattern formed of or including an amorphous carbon having an excellent etch selectivity and hardness is formed on sidewalls of the hard mask pattern or over the hard mask pattern so that a sidewall loss or deformation of the hard mask pattern during a etch process for forming the variable resistance element can be prevented, even if sidewall deterioration occurs during forming the hard mask pattern. Therefore, the hard mask pattern can sufficiently serve to etch barrier and secure a uniform vertical profile of the variable resistance element. As a result, it is possible to prevent a distortion of the electrical characteristics of the variable resistance element, thereby improving performance the variable resistance element.

A semiconductor memory device as disclosed in this document may include a cell array of variable resistance elements 10 to store data. The semiconductor memory may further include various components such as lines, elements, etc. to drive or control each variable resistance element 10. This is exemplarily explained with reference to FIGS. 7 and 8.

Figure 7:
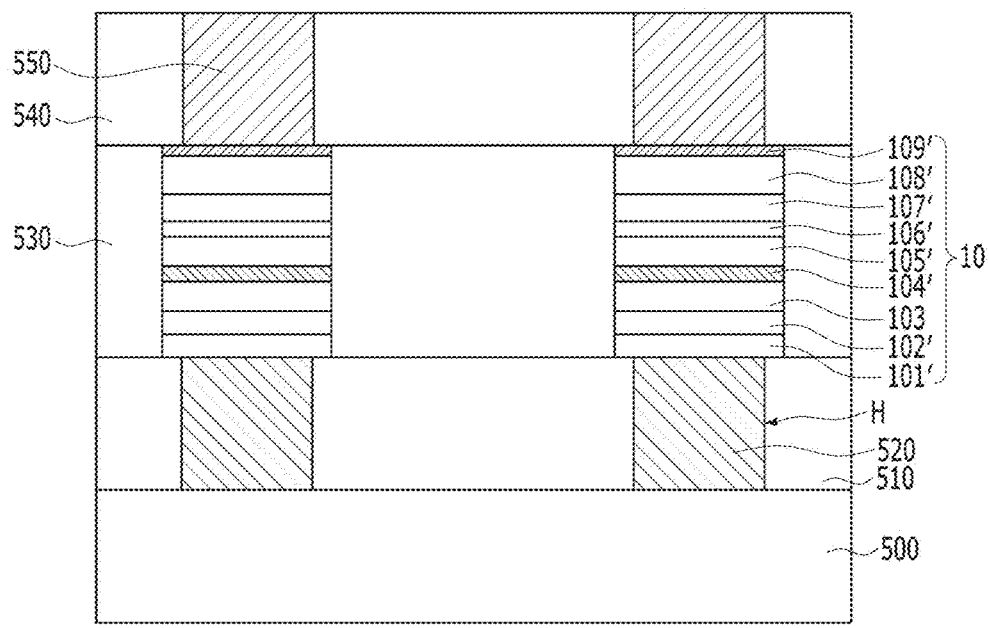
FIG. 7 is a cross-sectional view illustrating an exemplary memory device and a method for fabricating the same in accordance with an implementation of the disclosed technology.

FIG. 7 is a cross-sectional view for explaining a memory device and a method for fabricating the same in accordance with an implementation of the disclosed technology.

Referring to FIG. 7, the memory device of the implementation may include a substrate 500, lower contacts 520 formed over the substrate 500, variable resistance element 10 formed over the lower contacts 520 and upper contacts 550 formed over the variable resistance element 10. For each variable resistance element 10, a specific structure as a switch or switching circuit/element, for example, a transistor, for controlling an access to a particular variable resistance element 10 can be provided over the substrate 500 to control the variable resistance element 10, where the switch can be turned on to select the variable resistance element 10 or turned off to de-select the variable resistance element 10. The lower contacts 520 may be disposed over the substrate 500, and couple a lower end of the variable resistance element 10 to a portion of the substrate 500, for example, a drain of the transistor as the switching circuit for the variable resistance element 10. The upper contact 550 may be disposed over the variable resistance element 10, and couple an upper end of the variable resistance element 10 to a certain line (not shown), for example, a bit line. In FIG. 7, two variable resistance elements 10 are shown as examples of the elements in an array of variable resistance elements 10.

First, the substrate 500 in which the transistor or the like is formed may be provided, and then, a first interlayer dielectric layer 510 may be formed over the substrate 500. Then, the lower contact 520 may be formed by selectively etching the first interlayer dielectric layer 510 to form a hole H exposing a portion of the substrate 500 and filling the hole H with a conductive material. Then, the variable resistance element 10 may be formed by forming material layers for the variable resistance element 10 over the first interlayer dielectric layer 510 and the lower contact 520, and selectively etching the material layers. The etch process for forming the variable resistance element 10 may include the IBE method which has a strong physical etching characteristic. Then, a second interlayer dielectric layer 530 may be formed to cover the variable resistance element. Then, a third interlayer dielectric layer 540 may be formed over the variable resistance element 10 and the second interlayer dielectric layer 530, and then upper contacts 550 passing through the third interlayer dielectric layer 540 and coupled to an upper end of the variable resistance element 10 may be formed.

In the memory device in accordance with this implementation, all layers forming the variable resistance element 10 may have sidewalls which are aligned with one another. That is because the variable resistance element 10 is formed through an etch process using one mask.

Unlike the implementation of FIG. 7, a part of the variable resistance element 10 may be patterned separately from other parts. This process is illustrated in FIG. 8.

Figure 8:
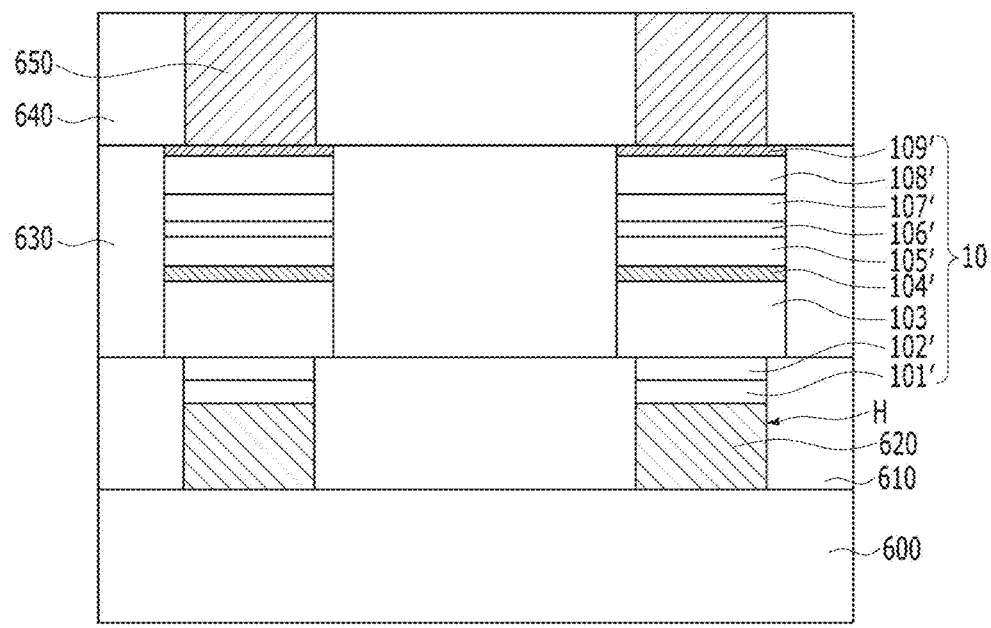
FIG. 8 is a cross-sectional view illustrating another exemplary memory device and a method for fabricating the same in accordance with an implementation of the disclosed technology.

FIG. 8 is a cross-sectional view for explaining a memory device and a method for fabricating the same in accordance with another implementation of the present disclosure. The following descriptions will be focused on a difference from the implementation of FIG. 7.

Referring to FIG. 8, the memory device in accordance with this implementation may include a variable resistance element 10 of which parts, for example, a buffer layer pattern 101' and an under layer pattern 102' have sidewalls that are not aligned with other layers thereof. As shown in FIG. 8, the buffer layer pattern 101' and the under layer pattern 102' may have sidewalls which are aligned with lower contacts 620.

The memory device in FIG. 8 may be fabricated by following processes.

First, a first interlayer dielectric layer 610 may be formed over a substrate 600, and then selectively etched to form a hole H exposing a portion of the substrate 600. The, the lower contacts 620 may be formed to fill a lower portion of the hole H. For example, the lower contacts 620 may be formed through a series of processes of forming a conductive material to cover the resultant structure having the hole formed therein, and removing a part of the conductive material through an etch back process or the like until the conductive material has a desired thickness. Then, the buffer layer pattern 101' and the under layer pattern 102' may be formed so as to fill the remaining portion the hole H. For example, the buffer layer pattern 101' may be formed by forming a material layer for forming the buffer layer pattern 101' which covers the resultant structure in which the lower contacts 620 is formed, and then removing a portion of the material layer by, for example, an etch-back process until the material layer has a desired thickness. Moreover, the under layer pattern 102' may be formed by forming a material layer for forming the under layer pattern 102' which covers the resultant structure in which the lower contacts 620 and the buffer layer pattern 101' are formed, and then performing a planarization process such as a CMP (Chemical Mechanical Planarization) until a top surface of the first interlayer dielectric layer 610 is exposed. Then, the remaining parts of the variable resistance element 10 may be formed by forming material layers for forming the remaining layers of the variable resistance element 10 except the buffer layer pattern 101' and the under layer pattern 102' over the lower contacts 620 and the first interlayer dielectric layer 610.

Subsequent processes are substantially the same as those as shown in FIG. 7.

In this implementation, the height which needs to be etched at a time in order to form the variable resistance element 10 can be reduced, which makes it possible to lower the difficulty level of the etch process.

Although in this implementation, the buffer layer pattern 101' and the under layer pattern 102' are buried in the hole H, other parts of the variable resistance element 10 may also be buried as needed.

The above and other memory circuits or semiconductor devices based on the disclosed technology can be used in a range of devices or systems. FIGS. 9 to 13 provide some examples of devices or systems that can implement the memory circuits disclosed herein.

Figure 9:
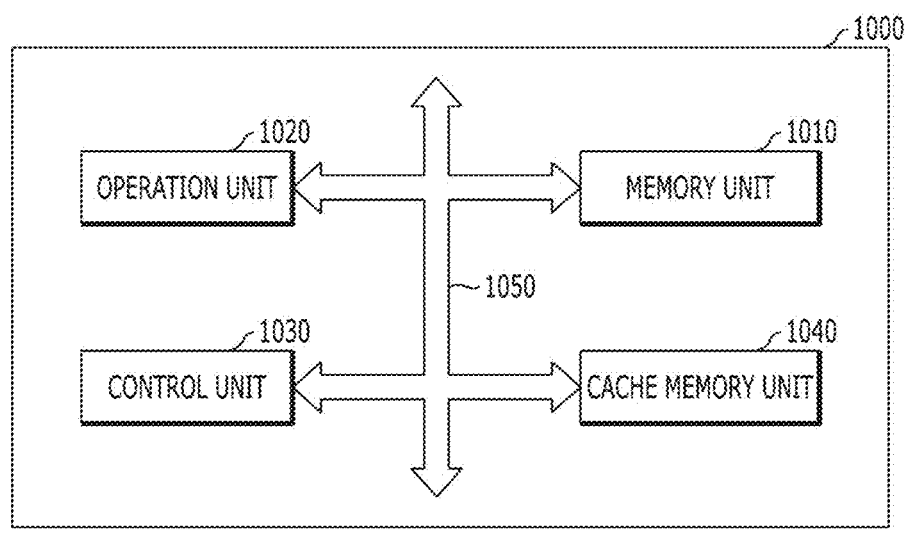
FIG. 9 is an example of configuration diagram of a microprocessor implementing memory circuitry based on an implementation of the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a predetermined structure; a hard mask pattern disposed over the predetermined structure and including an amorphous carbon layer; and a capping protective layer disposed on sidewalls of the hard mask pattern. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
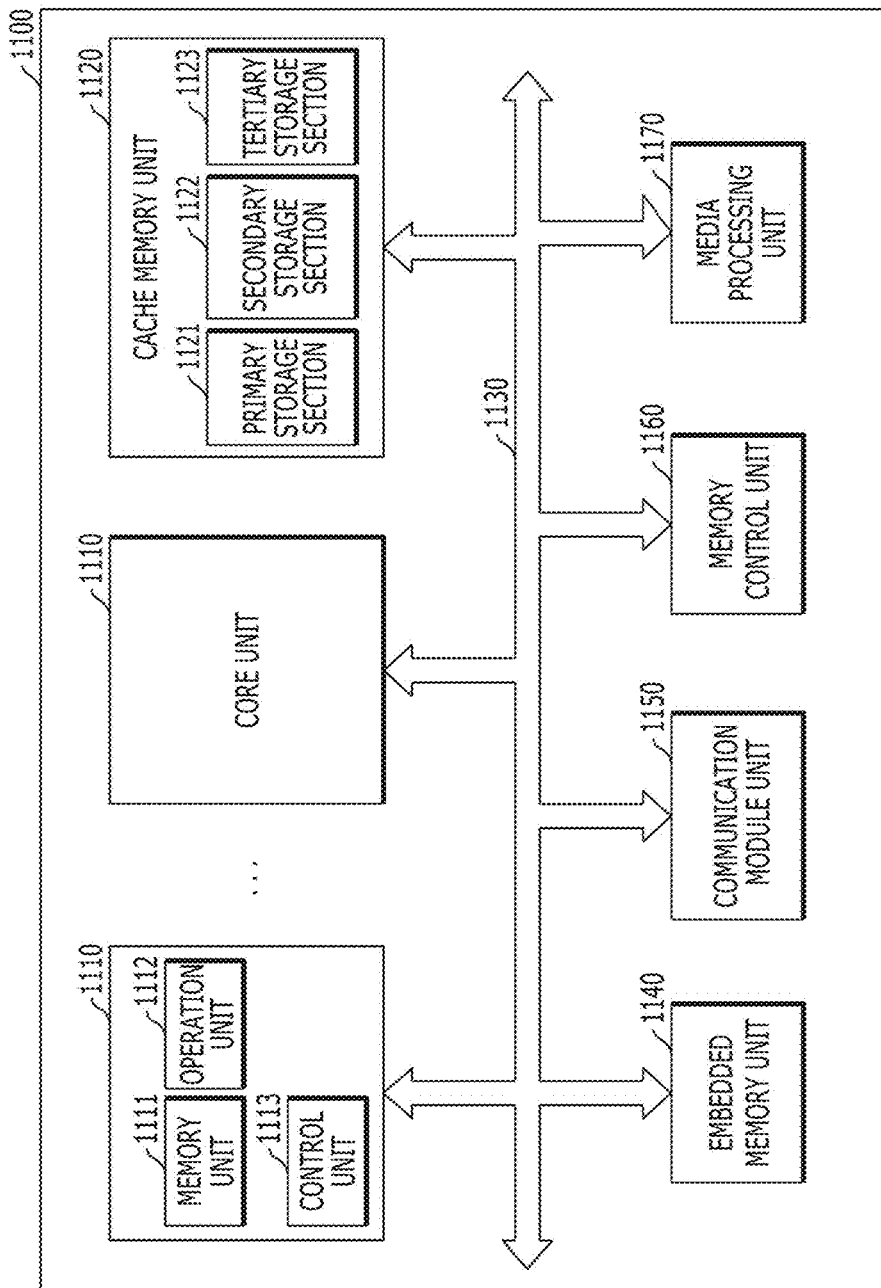
FIG. 10 is an example of configuration diagram of a processor implementing memory circuitry based on an implementation of the disclosed technology.

FIG. 10 is an example of configuration diagram of a processor implementing memory circuitry based on an implementation of the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a predetermined structure; a hard mask pattern disposed over the predetermined structure and including an amorphous carbon layer; and a capping protective layer disposed on sidewalls of the hard mask pattern. Through this, data storage characteristics of the cache memory unit 1120 may be improved. As a consequence, operating characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
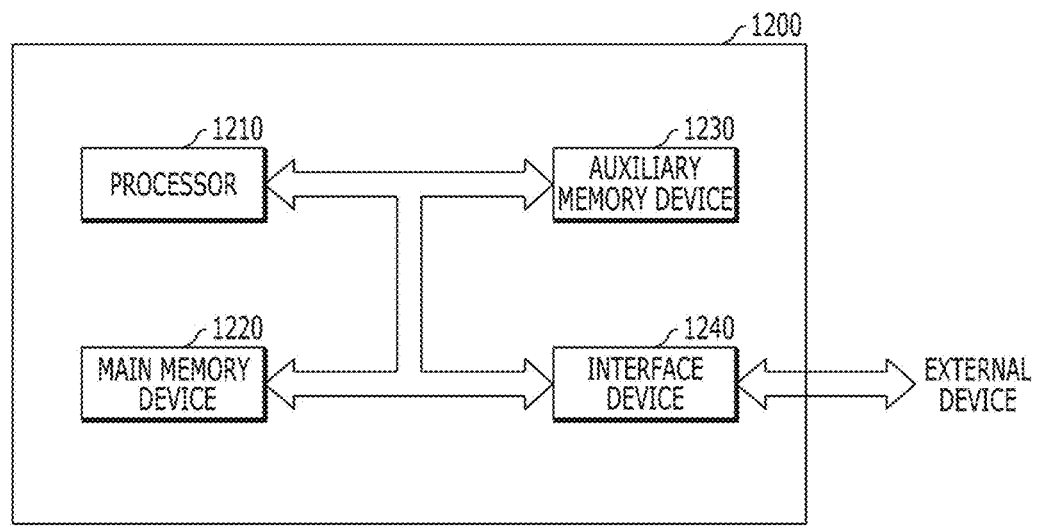
FIG. 11 is an example of configuration diagram of a system implementing memory circuitry based on an implementation of the disclosed technology.

FIG. 11 is an example of configuration diagram of a system implementing memory circuitry based on an implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a predetermined structure; a hard mask pattern disposed over the predetermined structure and including an amorphous carbon layer; and a capping protective layer disposed on sidewalls of the hard mask pattern. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a predetermined structure; a hard mask pattern disposed over the predetermined structure and including an amorphous carbon layer; and a capping protective layer disposed on sidewalls of the hard mask pattern. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
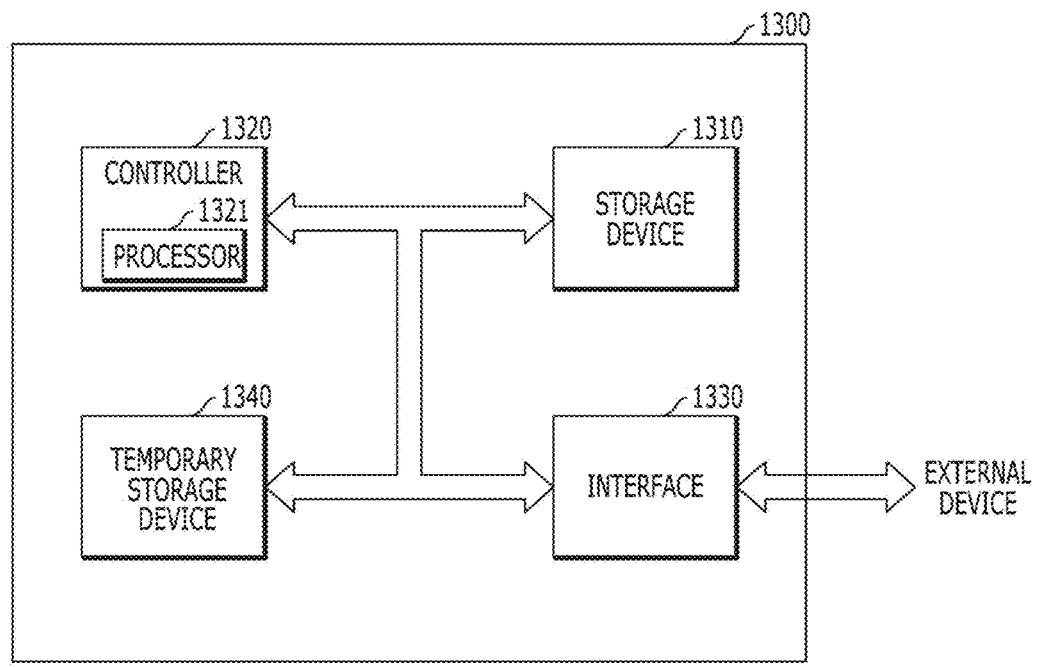
FIG. 12 is an example of configuration diagram of a data storage system implementing memory circuitry based on an implementation of the disclosed technology.

FIG. 12 is an example of configuration diagram of a data storage system implementing memory circuitry based on an implementation of the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a predetermined structure; a hard mask pattern disposed over the predetermined structure and including an amorphous carbon layer; and a capping protective layer disposed on sidewalls of the hard mask pattern. Through this, data storage characteristics of the storage device 1310 or the temporary storage device 1340 may be improved. As a result, operating characteristics and data storage characteristics of the data storage system 1300 may be improved.

Figure 13:
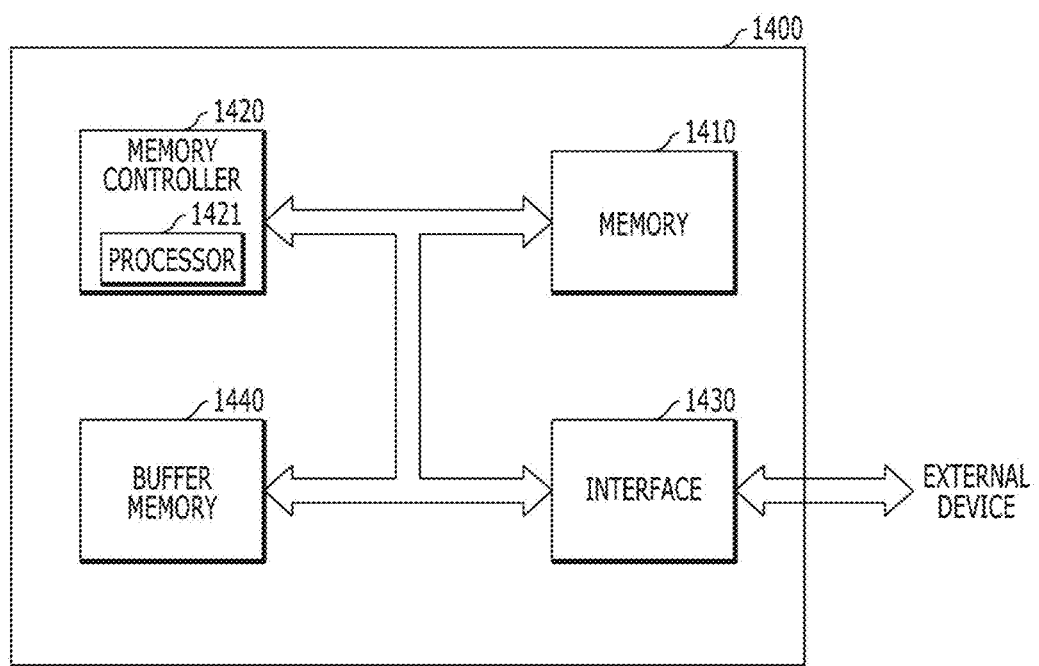
FIG. 13 is an example of configuration diagram of a memory system implementing memory circuitry based on an implementation of the disclosed technology.

FIG. 13 is an example of configuration diagram of a memory system implementing memory circuitry based on an implementation of the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a predetermined structure; a hard mask pattern disposed over the predetermined structure and including an amorphous carbon layer; and a capping protective layer disposed on sidewalls of the hard mask pattern. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a predetermined structure; a hard mask pattern disposed over the predetermined structure and including an amorphous carbon layer; and a capping protective layer disposed on sidewalls of the hard mask pattern. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device comprising a semiconductor memory, the method comprising:
   forming material layers over a substrate;
   forming a hard mask pattern over the material layers, the hard mask pattern including an amorphous carbon layer;
   forming a capping protective layer including a portion on sidewalls of the hard mask pattern; and
   etching the material layers using the hard mask pattern as an etch barrier,
   wherein the forming of the capping protective layer is performed before the etching of the material layers, wherein the capping protective layer is configured to protect the hard mask pattern during the etching of the material layers, and wherein the forming of the capping protective layer includes:

forming a metal layer over the hard mask pattern and on the sidewalls of the hard mask pattern; and subjecting the metal layer to native oxidation.

2. The method of claim 1, wherein the capping protective layer includes a metal, an oxide, or a nitride, or a combination thereof.

3. The method of claim 1, wherein the capping protective layer includes $Al_2O_3$, $SiO_2$, SiN, TiN, AlN, BN, Ta, W, Mo, Fe, Al, Cu, or Si, or a combination thereof.

4. The method of claim 1, wherein the capping protective layer is formed to include another portion over a top surface of the hard mask pattern.

5. The method of claim 1, wherein the forming of the capping protective layer includes performing a thermal atomic layer deposition process, a plasma chemical vapor deposition process, an ion beam deposition process, or a sputtering process.

6. The method of claim 1, wherein the forming of the capping protective layer includes:

performing a physical etch process on the material layers and the hard mask pattern so that metals included in the material layers is redeposited on the sidewalls of the hard mask pattern.

7. The method of claim 6, wherein the physical etch process includes an ion beam etching or a reactive ion etching, with an incident angle of ions of 0 to 30 degrees.

8. The method of claim 1, wherein the etching of the material layers includes providing a variable resistance element which includes an MTJ (Magnetic Tunnel Junction) structure including a free layer having a variable magnetization direction, a pinned layer having a fixed magnetization direction, and a tunnel barrier layer interposed between the free layer and the pinned layer, and wherein the hard mask pattern is disposed over the variable resistance element.

9. The method of claim 8, wherein the forming of the material layers includes:

forming a material layer for the free layer, a material layer for the tunnel barrier layer and a material layer for the pinned layer.

10. The method of claim 1, wherein the capping protective layer is formed to include another portion over a top surface of the material layers where the hard mask is not formed.

11. The method of claim 1, further comprising removing the hard mask pattern and the capping protective layer after the etching of the material layers.

12. A method for fabricating an electronic device comprising a semiconductor memory, the method comprising:

forming material layers over a substrate;

forming a hard mask pattern over the material layers, the hard mask pattern including an amorphous carbon layer;

forming a capping protective layer including a portion on sidewalls of the hard mask pattern; and etching the material layers using the hard mask pattern as an etch barrier, wherein the forming of the capping protective layer is performed before the etching of the material layers, wherein the capping protective layer is configured to protect the hard mask pattern during the etching of the material layers, and wherein the hard mask pattern and the capping protective layer are removed during the etching of the material layers.

13. The method of claim 1, wherein the etching of the material layers includes providing a variable resistance element including some of the material layers and configured to store different data depending on a resistance state of the variable resistance element.

14. The method of claim 13, wherein the forming of the material layers includes forming a buffer layer disposed under the some of the material layers and including a metal, a metal alloy, a metal nitride, or a metal oxide, or a combination thereof.

15. The method of claim 1, wherein the forming of the material layers includes forming a magnetic correction layer including a ferromagnetic material and configured to have a magnetization direction anti-parallel to a magnetization direction of a pinned layer of the variable resistance element.

16. The method of claim 15, wherein the magnetic correction layer is disposed under the some of the materials layers used for the variable resistance element.

17. The method of claim 15, wherein the magnetic correction layer is disposed above the some of the material layers used for the variable resistance element.

18. The method of claim 12, wherein the capping protective layer includes a metal, an oxide, or a nitride, or a combination thereof.

* * * * *